United States Patent [19]

Whatmore et al.

[11] Patent Number: 4,634,913
[45] Date of Patent: Jan. 6, 1987

[54] APPLICATION OF LITHIUM TETRABORATE TO ELECTRONIC DEVICES

[75] Inventors: Roger W. Whatmore, Bletchley; Iain M. Young, Malvern, both of England

[73] Assignee: Plessey Overseas Limited, Ilford, England

[21] Appl. No.: 703,653

[22] Filed: Feb. 21, 1985

Related U.S. Application Data

[63] Continuation-in-part of Ser. No. 625,590, Jun. 29, 1984, Pat. No. 4,523,119, which is a continuation of Ser. No. 271,112, Jun. 8, 1981, abandoned.

[30] Foreign Application Priority Data

Jun. 11, 1980 [GB] United Kingdom ............... 8019062
Dec. 23, 1980 [GB] United Kingdom ............... 8041183

[51] Int. Cl.$^4$ .................................. H01L 41/08
[52] U.S. Cl. .................................. 310/313 A; 310/360; 310/313 D
[58] Field of Search ............... 310/313 A, 313 D, 360

[56] References Cited

U.S. PATENT DOCUMENTS 4,523,119 6/1985 Whatmore et al. ............ 310/313 A

Primary Examiner—Mark O. Budd
Attorney, Agent, or Firm—Fleit, Jacobson, Cohn & Price

[57] ABSTRACT

An electronic device, such as a Surface Wave, Bulk Wave or pyroelectric device, exploiting the polar nature of an active material in which the active material is lithium tetraborate or a closely related compound for example one which is slightly deficient in Lithium or Boron e.g. $(Li_{2\mp\delta_1})B_4O_7$ or $Li_2(B_{4\mp\delta_2})O_7$ where $\delta_1$ and $\delta_2$ are small numbers.

8 Claims, 24 Drawing Figures

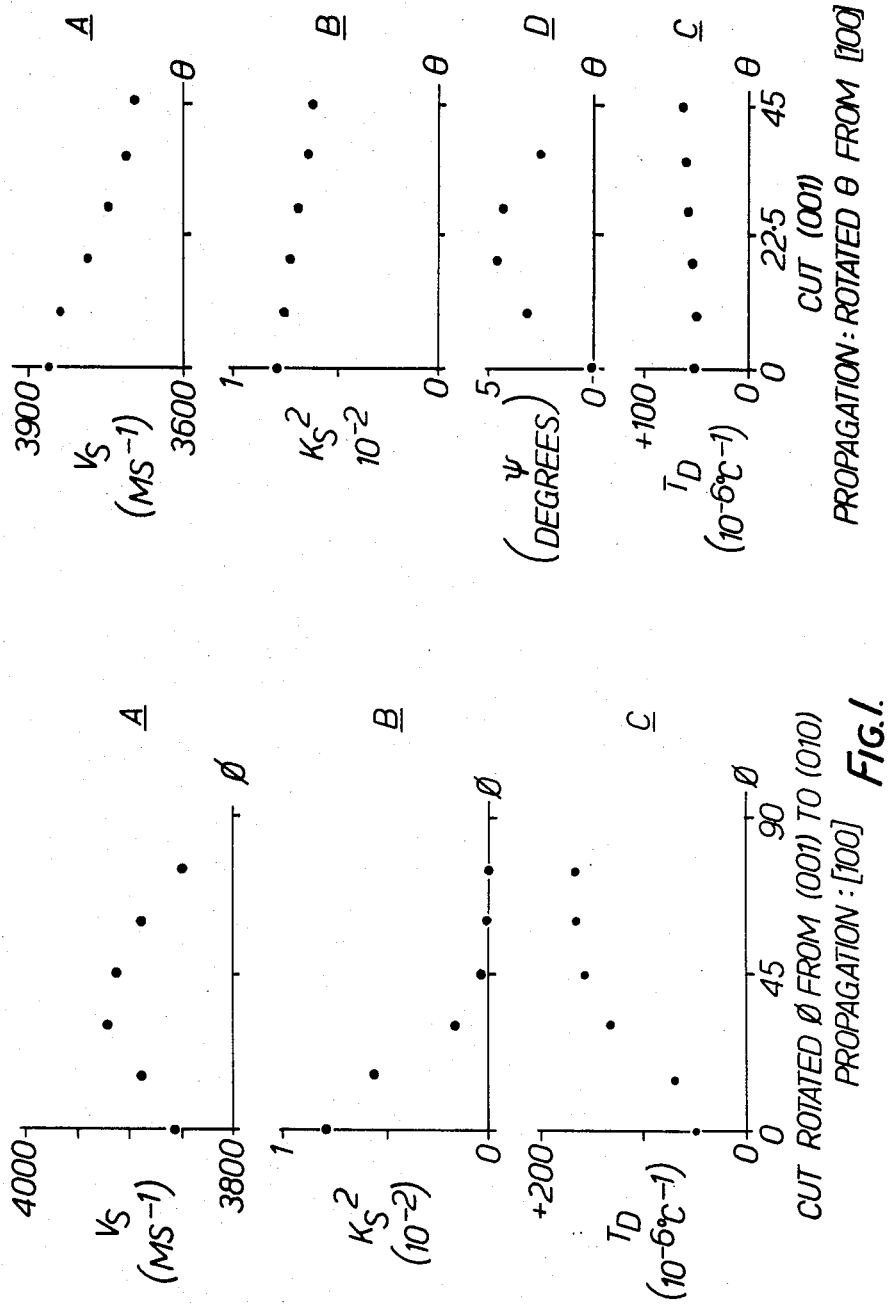

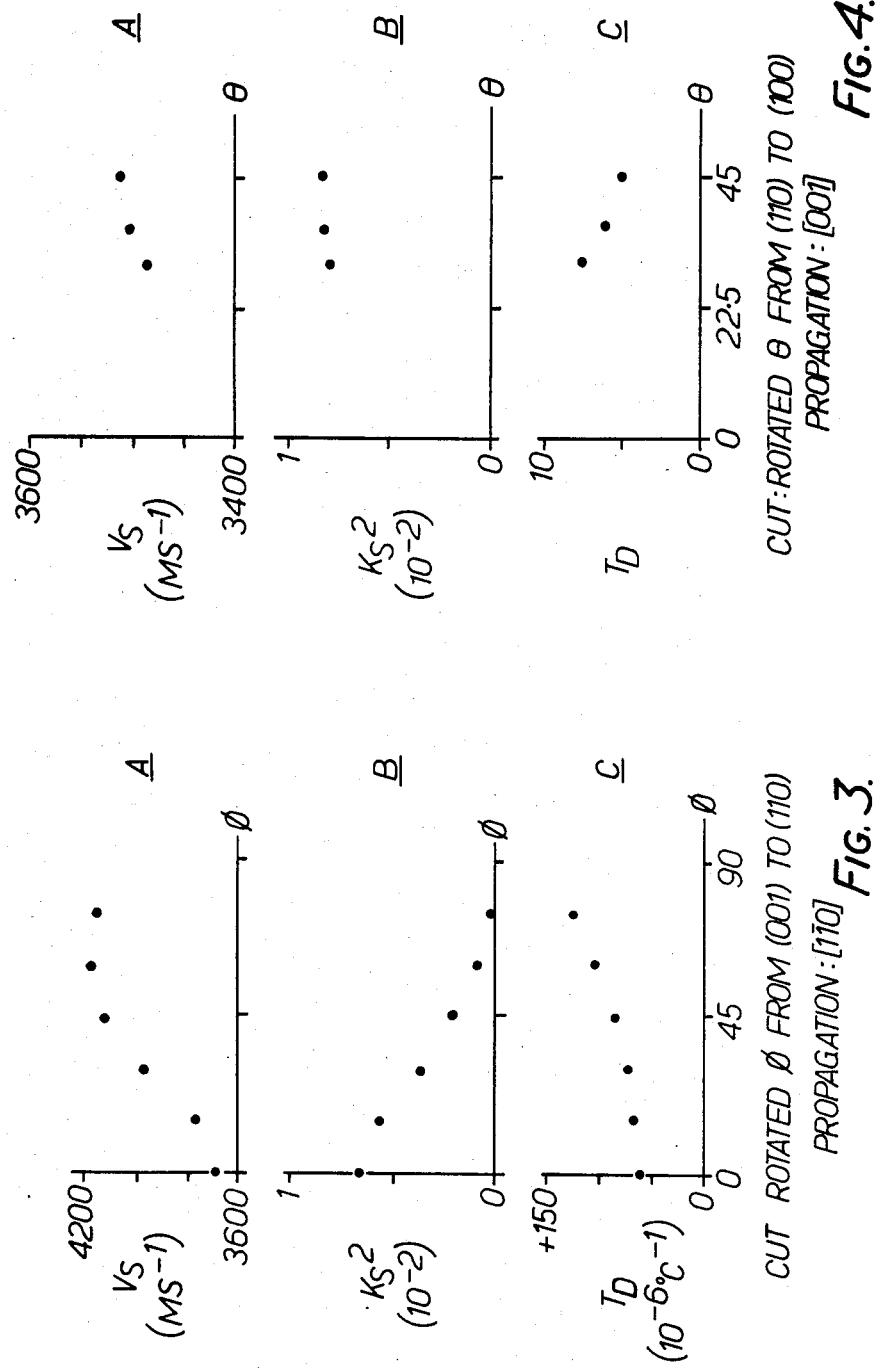

CUT: ROTATED ∅ FROM (001) TO (100)
PROPAGATION: PERPENDICULAR TO [010]

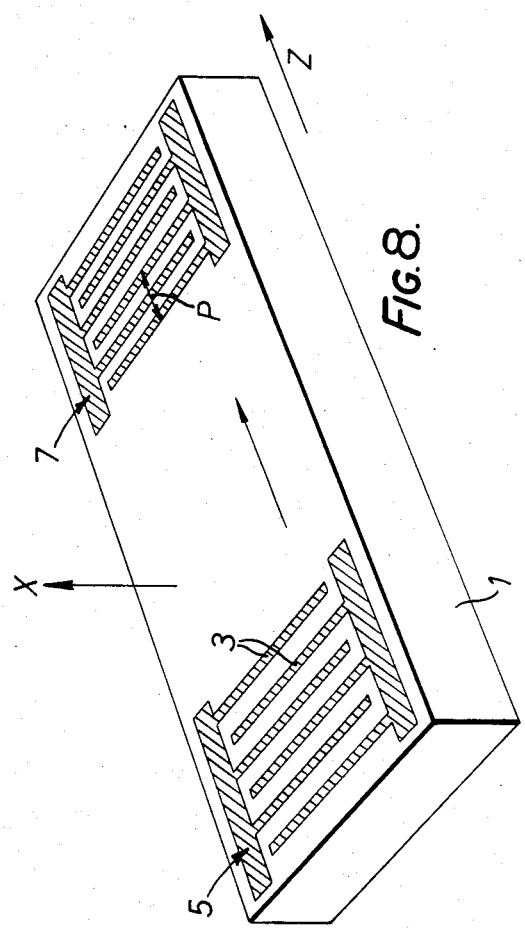
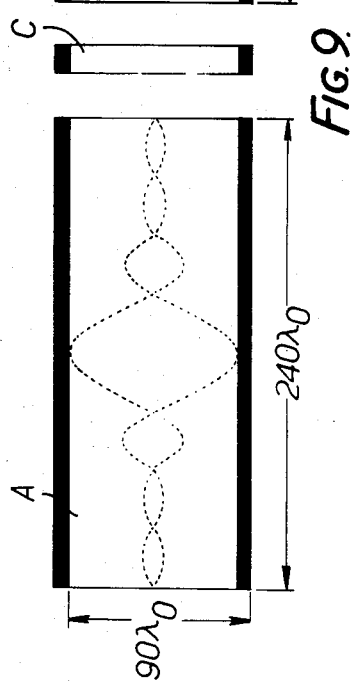
Fig. 8.
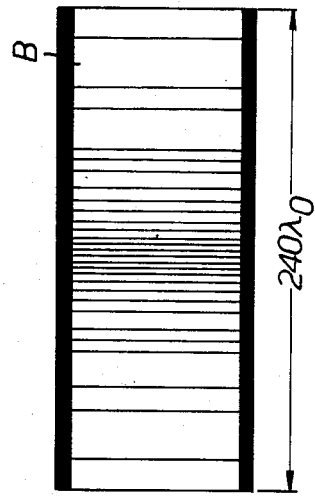
Fig. 9.

APPLICATION OF LITHIUM TETRABORATE TO ELECTRONIC DEVICES

This application is a continuation-in-part of U.S. patent application Ser. No. 625,590 dated June 29, 1984, now U.S. Pat. No. 4,523,119 issued June 11, 1985, a continuation of U.S. patent application Ser. No. 271,112 dated June 8, 1984 (abandoned).

The present invention relates to the application of lithium tetraborate to electronic devices and in particular to surface acoustic wave, bulk wave resonant, and pyroelectric detection, devices. It also relates to devices used for the generation and detection of bulk waves in solids and liquids and devices for generation and detection of static displacements. Such devices are defined for the purpose of this invention as Electronic devices exploiting the polar nature of a material.

A surface acoustic wave device is defined for the purpose of the present invention as an electronic device which uses a piezoelectrically generated Rayleigh wave. Such devices include: Band Pass Filters; Delay Lines; Tapped Delay Lines; Reflective Array Pulse Compression Filters; Chirped transducer filters; and, Parametric Devices including Convolvers.

A Bulk Wave Piezoelectric device is defined for the purpose of the present invention as an electronic device employing waves propagating in the bulk of the crystal material. Such devices include Band Pass Filters and Transducers for non destructive testing; Sonar devices eg. Hydrophones; and Bulk Wave piezo-electric delay lines.

A pyroelectric device is defined for the purpose of the present invention as a device which uses pyroelectrically generated charge for sensing changes in temperature. Such devices include: Pyroelectric Thermal Imagers in which the pyroelectric target is scanned by a beam of charged particles; and, Single and Multi-element detector arrays for use in equipment such as intruder alarms.

A suitable material for piezoelectric surface acoustic wave, bulk wave resonant and bulk wave transducer devices should possess defined electromechanical coupling and temperature compensation properties.

For further background information concerning surface and bulk wave piezo-electric devices, the reader is referred to:

R. Holland "Design of Resonant Piezo-electric Devices" (1969) Research Monograph No. 56. The MIT Press, Cambridge, Mass.; and B. A. Auld (1981) "Wave Propagation and Resonance in Piezo-electric Materials" J. Acoust. Soc. Am. 70(6) 1577–85.

Also for information concerning pyroelectric detector devices, the reader is invited to refer to:

S. G. Porter (1981) "A Brief Guide to Pyroelectric Detectors" Ferroelectrics 33 193-206.

S. T. Liu and D. Long (1978) "Pyroelectric Detectors and Materials" Proc. IEEE 66(1) 14-26.

It is an object of the present invention to provide surface acoustic wave and bulk wave devices with good electrical and mechanical properties, determined by the choice of material.

The present invention provides an Electronic Device exploiting the polar nature of an active material in which the active material is lithium tetraborate. Lithium tetraborate is herein defined to include closely related compounds which for example, contain slight deficiencies or excess of Lithium or Boron e.g. ($Li_2 \mp \delta_1 B_4 O_7$ or $Li_2 B_4 \mp \delta_2 O_7$) where $\delta_1$, and $\delta_2$ are small numbers.

Lithium Tetraborate possesses the point symmetry 4 mm. The Z-axis is conventionally defined as being parallel to the 4-fold symmetry axis. The X-axis is defined as being perpendicular to the Z-axis and parallel to the crystallographic [100] direction. The Y-axis is mutually perpendicular to the X-and Z-axes.

An X-cut Z-propagating crystal or one that is close to X-cut and Z-propagating is particularly suited to Surface Acoustic Wave Devices; a Z-cut crystal orientation is particularly suited to Bulk wave devices; and, a Z-cut crystal is particularly suited to pyroelectric devices.

The choice of the material is however not the only factor in determining the characteristics of a surface wave or bulk wave device. The identification and selection of the crystal cut is a determining factor in the property of the device. By the choice of an appropriate angle of cut the characteristics of the material can be made to suit the particular required device. Appropriate cuts for the lithium tetraborate will be described hereinafter for various devices.

Lithium tetraborate, $Li_2B_4O_7$, has been found to be a material which shows anomalous elastic constant temperature behaviour (i.e. certain coefficients of the elastic stiffness tensor increase with increasing temperature) which has been demonostrated by measurement using ultrasonic pulse-echo and piezoelectric resonance techniques. This means that the material may possess crystal cuts for piezoelectric bulk wave and SAW (surface acoustic wave) devices which show zero temperature coefficients of frequency. The piezoelectric coupling factors for the material are moderate (for a Z-plate $K_T \approx 0.4$) which means that the bulk-wave and SAW coupling factors will be larger than those in quartz. The combination of the presence of temperature-compensated cuts with good piezoelectric coupling gives the material several advantages over the two materials most commonly used for SAW and bulk-wave devices: $LiNbO_3$ and $\alpha$-quartz (the former possesses good electromechanical coupling but shows no temperature compensation, while the latter shows temperature compensation but possesses only poor electromechanical coupling factors). These advantages include the ability to make wider bandwidth devices, showing smaller insertion losses than similar devices on $\alpha$-quartz, while maintaining good frequency temperature stability.

Embodiments of the present invention will now be described by way of example with reference to the accompanying drawings in which:

FIGS. 1 to 5 show for various crystal cuts as specified in graphs A, B and C respectively the variations of surface acoustic wave (S.A.W.) velocity Vs: SAW coupling factor $K_s^2$ (defined conventionally as $K_s^2 \approx 2\delta V/Vs$ where V is the change in velocity of the surface wave which occurs as it passes under a conducting plane on the substrate surface) and $T_D$ the first order temperature coefficient of SAW delay with the change in the substrate orientation and SAW propogation direction. FIG. 2 also shows in graph D the variation in SAW power-flow angle;

FIG. 8 is a schematic perspective view of a surface acoustic wave device using an X-cut slice of lithium tetraborate crystal as substrate;

FIG. 9 is a plan view showing the layout of interdigitated transducers for a narrow-band SAW device.

Figure 5:
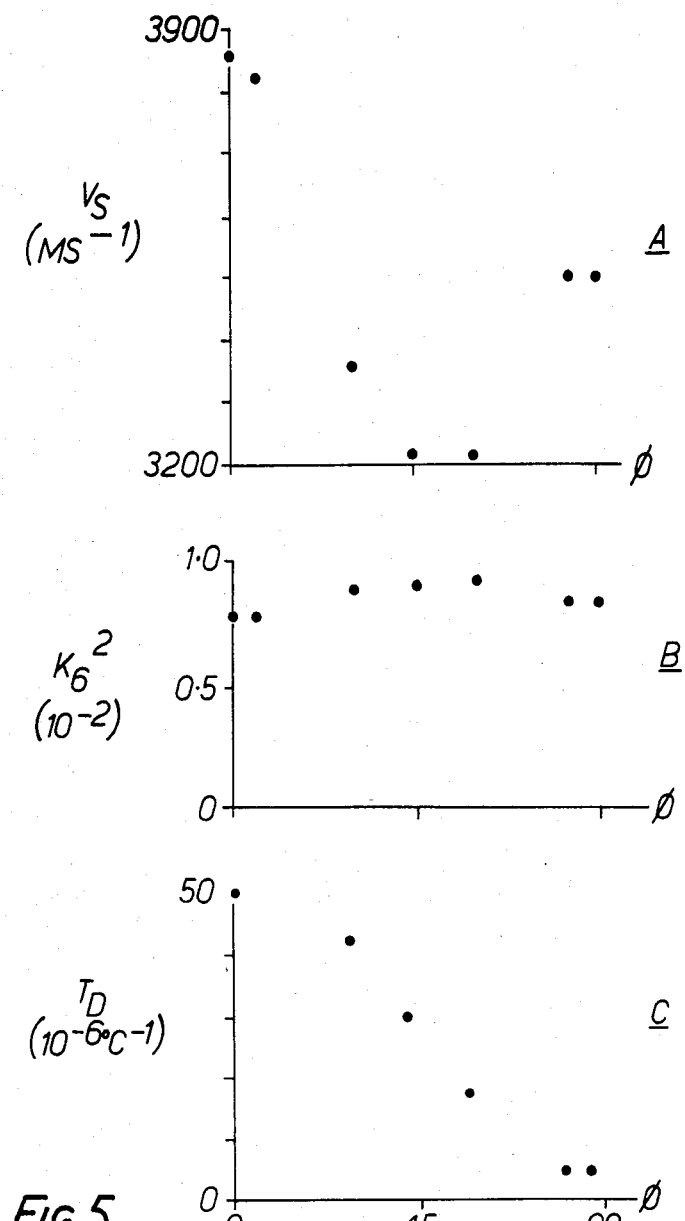

Initial measurements of the piezoelectric and elastic properties of lithium tetraborate have indicated its promise as a piezoelectric surface acoustic wave (SAW) substrate and bulk wave (BW) resonator material. Table 1 shows the values of the elastic constant, dielectric constant and piezoelectric coefficient tensor moduli at a temperature of 20° C. Also listed in this table are the first order temperature coefficients of these moduli and the estimated errors in the various quantities.

TABLE 1

THE PIEZOELECTRIC, ELASTIC AND DIELECTRIC CONSTANT TENSOR COEFFICIENTS OF Li$_2$B$_4$O$_7$.

| Coefficient | Value at 20° C. | Estimated Error | Units | First-Order Temperature Coefficient ($10^{-6}$ °C.$^{-1}$) |
|---|---|---|---|---|
| $c_{11}^E$ | 12.71 | 0.11 | $10^{10}$ Nm$^{-2}$ | −51 |
| $c_{12}^E$ | 0.6 | 0.20 | " | +1600 |
| $c_{13}^E$ | 2.94 | 0.15 | " | +390 |
| $c_{33}^E$ | 5.38 | 0.83 | " | −21 |
| $c_{44}^E$ | 5.38 | 0.04 | " | −22 |
| $c_{66}^E$ | 5.74 | 0.05 | " | −200 |
| $e_{15}$ | 0.278 | 0.005 | Cm$^{-2}$ | −349 |
| $e_{31}$ | 0.10 | 0.04 | " | −2300 |
| $e_{33}$ | 0.77 | 0.04 | " | +385 |
| $\epsilon_{11}^S$ | 0.80 | 0.01 | $10^{-10}$ Fm$^{-1}$ | −92 |
| $\epsilon_{33}^S$ | 0.78 | 0.01 | " | +120 |

$C_{ij}^E$'s are elastic constant stiffness coefficients at constant electric field
$e_{ij}$'s are piezoelectric coefficients
$\epsilon_{ij}^S$'s are crystal permittivities at constant strain As stated, a principal use of the material will be for SAW applications. The properties suitable for such applications are illustrated in FIGS. 1 to 7.

FIGS. 1 to 5 show the computed variations of SAW velocity (V$_S$), SAW coupling factor $k_s^2$ and the first order temperature coefficient of SAW delay with the change in the substrate orientation and the SAW propogation direction. Also shown, where appropriate, is the variation in SAW power-flow angle $\tau$. The first set of orientations of interest are those shown in FIG. 1. It can be seen that the computed SAW velocity maximises at 3920 ms$^{-1}$ for $\phi=30°$ while $k_s^2$ decreases from $0.8 \times 10^{-2}$ at $\phi=0$ to a value of $0.04 \times 10^{-2}$ for $\phi=45°$. All the orientations in this series show $T_D > 49 \times 10^{-6}$ °C$^{-1}$. Thus $k_s^2$ values are higher for the series of orientations represented in FIG. 2, being in all cases greater than $0.65 \times 10^{-2}$. The predicted $T_D$ values vary from $49 \times 10^{-6}$ °C$^{-1}$ for $\theta=0°$ to $63 \times 10^{-6}$ °C$^{-1}$ for $\theta=45°$.

Non-zero power-flow angles are observed for all orientations in this set with $0 < \theta < 45°$. FIG. 3 shows the variations in SAW properties which occurs for (110) propogating waves as the substrate plane normal is rotated $\phi$ from (001) to (110). The SAW velocity increases from 3693 ms$^{-1}$ for $\phi=0$ to 4152 ms$^{-1}$ for $\phi=75°$. The $k_s^2$ value, however, decreases from $0.65 \times 10^{-2}$ $\phi=0$ to $0.016 \times 10^{-2}$ for $\phi=75°$. The orientation with the most promising predicted properties appears in FIG. 4 with $\phi=45°$, corresponding to an X-cut, Z-propagating device, this is predicted to possess V$_s$=3510 ms$^{-1}$, $k_s^2$=0.82×10$^{-2}$ and $T_D$=+5×10$^{-6}$ °C$^{-1}$ at 20° C. Theoretical examination of this orientation over a wider temperature range has revealed that its time delay for surface waves is a parabolic function of temperature. It is, therefore, temperature compensated.

SAW delay lines with 48 μm wavelength, an aperture of 2.4 μm, 25 fingers per transducer and a transducer separation of 2.6 mm were deposited on selected substrate orientations of Li$_2$B$_4$O$_7$. Substrates were polished with Siton prior to deposition. A standard "float-off" procedure was used in which a negative photoresist was spun onto the substrate, windows defined in it and an Aluminum (Al) layer evaporated through the windows onto the exposed substrate surface, surplus Al being removed with the photoresist on washing.

Table 2a gives a comparison between some predicted and observed propagation properties for SAW delay lines fabricated on selected substrate cuts of lithium tetraborate. It can be seen that there is very good agreement between the observed and predicted properties for all substrates. As noted above, the X-cut, Z-propagating orientation is of particular interest as this is predicted to show a parabolic variation of SAW time delay with temperature. FIG. 8 shows the mean measured variation in the specific time delay ($\Delta\tau/\tau_0$) where $\tau_0$ is the delay at the turn-over temperature) from $-10°$ C. to $50°$ C. for several delay lines fabricated on the X-cut, Y-propagating orientation. Fitting the curves for the individual devices to an equation of the form:

$$\Delta\tau/\tau_0 = K_2(T-T_0)^2$$

gave the following mean constants $k_2$ and $T_o$:

$$K_2 = 227(\pm 50) \times 10^{-9}°C^{-2} \quad T_o = 12 \pm 5° \text{ C.}$$

The observed SAW velocity is very similar to that predicted (see Table 2a) while the observed value of $k_s^2$ is about 50% larger than the predicted value. The SAW properties of this orientation of lithium tetraborate are compared in Table 2b with those of several other conventional SAW substrate materials. It can be seen that the observed coupling factor $1.2 \times 10^{-2}$ compares very well with the $k_s^2$ for Y-cut, Z-propagating LiTaO$_3$ and (100)-cut, [011] propagating Bi$_{12}$SiO$_{20}$. The total variation in delay time from $-10°$ C. to $+40°$ C. for X-cut, Z-propagating Li$_2$B$_4$O$_7$ is $\pm 85$ ppm, this compares with $\pm 2350$ ppm in Y-cut, Z propagating LiNbO$_3$ and $\pm 850$ ppm in Y-cut, Z-propagating LiTaO$_2$ over the same temperature range. This degree of temperature compensation, combined with the SAW coupling factor of 1.2% makes X-cut, Z-propagating lithium tetraborate ideal for use in moderately-broad bandwidth SAW filters requiring good thermal stability.

tric, which removes any requirement to pole the material before use.

Specific devices for which the material is suitable include SAW delay lines filters and convolvers for use in radar, communications and domestic video equipment. It may also be used in acousto-optic devices exploiting the interactions between laser beams and a propagating surface wave and acousto-electric devices in which a semiconductor is placed in close proximity to the propagating SAW and the interactions between the electric field associated with the SAW and the charge carriers in the semiconductor are exploited.

As further examples of surface acoustic (SAW) devices using lithium tetraborate, the following items are described in detail:

1. Fabrication of SAW Devices on Li$_2$B$_4$O$_7$

Note that because of the crystal point symmetry defined above an X-cut, Z-propagating device is exactly equivalent to a Y-cut, Z-propagating device. Hence the two orientations (X and Y) can be interchanged in the description below.

FIG. 8 shows a drawing of a SAW device manufactured on an X-cut, Z-propagating substrate 1 of lithium tetraborate. In this case interdigital transducer fingers 3 are not split and possess equal overlaps over the full length of transducers 5, 7 (the transducer length being defined as the direction perpendicular to the finger TABLE 2a

PREDICTED AND OBSERVED SAW PROPERTIES OF LITHIUM TETRABORATE

| Orientation Angles in Degrees | | | | Predicted SAW Properties | | | Observed SAW Properties | | |
|---|---|---|---|---|---|---|---|---|---|
| $\Theta$ | $\Phi$ | $\alpha$ | Device Orientation | $V_s$ ms$^{-1}$ | $k_s^2$ | $T_D$ $10^{-6°}$ C.$^{-1}$ | $V_s$ ms$^{-1}$ | $k_s^2$ | $T_D$ $10^{-6°}$ C.$^{-1}$ |
| 90 | 6.7 | 90 | 6.7° X-axis Cylinder | $\pm 20$ | $0.008 \pm 0.001$ | 46 | $3808 \pm 9$ | 0.014 | 52 |
| 0 | 0 | 90 | Z-cut, X-Propagating | $3860 \pm 20$ | $0.008 \pm 0.001$ | 46 | $3873 \pm 21$ | 0.009 | 52 |
| 0 | 90 | 90 | X-cut, Z-Propagating | $3510 \pm 30$ | $0.008 \pm 0.001$ | Parabolic | $3510 \pm 6$ | 0.012 | Parabolic |
| 90 | 6.7 | 0 | 6.7° X-axix boule | $3860 \pm 20$ | $0.007 \pm 0.001$ | 53 | $3860 \pm 30$ | 0.014 | 46 |
| 0 | 0 | 45 | Z-cut, [110] Propagating | $3690 \pm 30$ | $0.007 \pm 0.001$ | 57 | $3710 \pm 30$ | 0.011 | 76 |

Thermal expansion coefficients @ 20° C.:-
$\alpha_{11} = 13 \times 10^{-6°}$ C.$^{-1}$.
$\alpha_{33} = 1.5 \times 10^{-6°}$ C.$^{-1}$.

TABLE 2b

A COMPARISON OF Li$_2$B$_4$O$_7$ WITH OTHER SAW SUBSTRATES

| Substrate Material | Orientation Angles in degrees | | | $V_s$ ms$^{-1}$ | $K_2^2$ $\times 10^2$ | $\psi$ (Deg.) | $T_D$ at 19° C. $10^{-6°}$ C.$^{-1}$ | Substrate Title |
|---|---|---|---|---|---|---|---|---|
| | $\Theta$ | $\Phi$ | $\alpha$ | | | | | |
| Quartz | 90 | 47.23 | 0 | 3159.5 | 0.14 | 0 | 0 | ST - cut |
| LiNbO$_3$ | 90 | 90 | 90 | 3491.1 | 4.86 | 0 | +94 | Y-cut, Z-propagating |
| LiTaO$_3$ | 90 | 90 | 90 | 3254 | 1.15 | 0 | +34 | Y-cut, Z-propagating |
| Bi$_{12}$SiO$_{20}$ | 0 | 90 | 45 | 1660 | 1.4 | 0 | +118 | (100)-cut, [011] propagating |
| Li$_2$B$_4$O$_7$ | 0 | 90 | 90 | 3510 | 1.2 | 0 | +5 | X-cut, Z-propagating |

Figure 6:
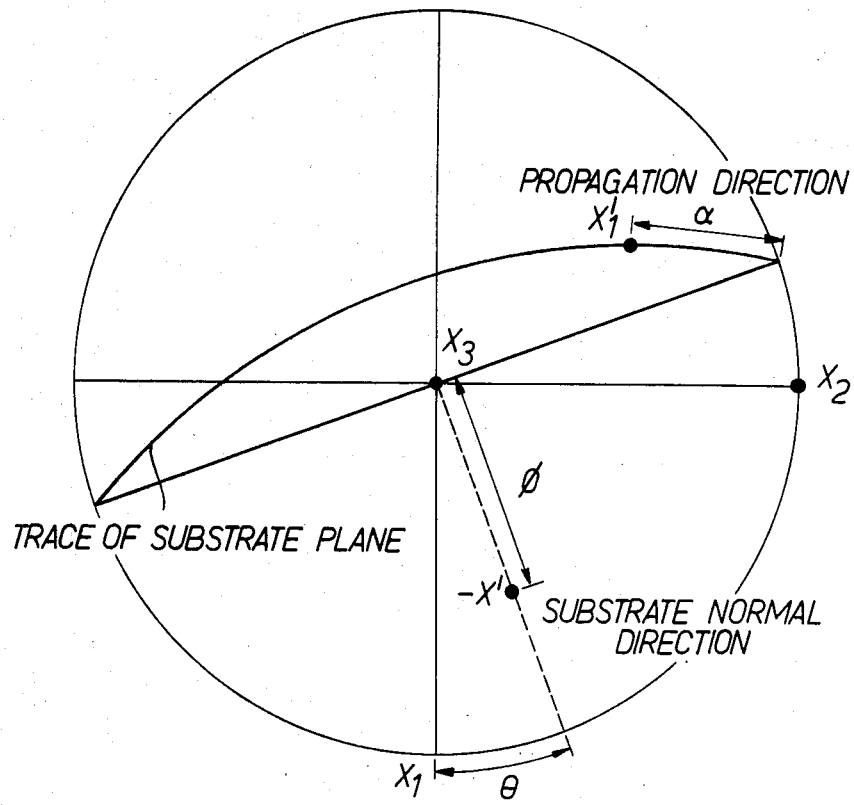
FIG. 6 is a stereogram showing the orientation of the substrate plane normal and the SAW propogation direction defined by angles $\alpha$, $\theta$ and $\phi$.
Figure 7:
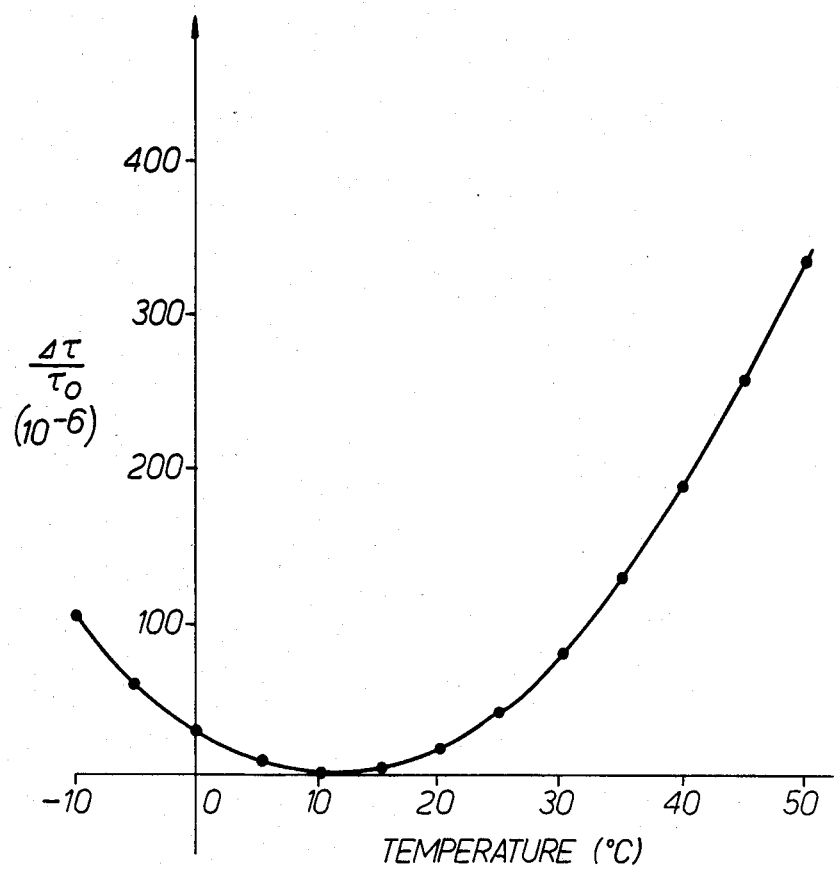
FIG. 7 shows the means measured variation in specific time delay with temperature for several SAW delay lines fabricated on X-cut, Z-propagating Li$_2$B$_4$O$_7$ substrates.

For definition of $\alpha$, $\Theta$, $\Phi$ - see FIG. 6.
$V_s$ = surface wave velocity
$k_s^2$ = coupling factor (SAW)
$\psi$ = power flow angle
$T_D$ = temperature coefficient of delay It is shown from this table that lithium tetraborate has several advantages over many of the other materials commonly-used for SAW devices. Other advantages include the facts that the material possesses a low melting point (950° C.; c.f. 1253° C. in LiNbO$_3$ and 1650° C. in LiTaO$_3$) which facilitates its growth by Czochralski techniques, and that it is a non-ferroelectric piezoeleclength and also to the wave fronts of the SAW's launched). However, the following details apply equally well to a device in which the fingers 3 are split into two or more elements and/or vary in overlap or spacing along the length of the device. The device can be manufactured in the following way:

(a) A single crystal substrate 1 of $Li_2B_4O_7$, oriented with its plane normal to the crystallographic X-axis, is polished on one side. (The substrate thickness is not critical to the process and any thickness which can be conveniently handled is suitable). The most suitable polishing medium for this is "Syton", a material well known to those skilled in the art. Note that in the text which follows, the polished face is referred to as the 'front' face and the opposite face (the state of polishing of which is irrelevant) is referred to as the 'back' face.

(b) The polished surface of the substrate 1 is cleaned using the following process. The substrate is exposed for a few minutes in a plasma asher, followed by a soak for 10 minutes each in toluene and acetone. After blowing dry, the substrate is gently scrubbed, and then rinsed, in 'Super Q' high purity water.

(c) The metallised fingers 3 of the SAW device can be fabricated on the polished surface in one of three ways. The surfaces 1 of $Li_2B_4O_7$ crystals are sensitive to attack by acidic etches and hence these must be excluded from any device processing schedule. The three processing methods can be summarized as follows:

Method I

A thin (between 500Å and 5000Å thick but most usually 1000Å) layer of a suitable metal or combination of metals is evaporated or sputtered in vacuum onto the polished surface of the substrate. Aluminium is the most suitable metal for this application.

A thin (~3000Å thick) layer of negative photoresist is spun onto the metallised face of the substrate and baked dry. A mask bearing the required pattern of SAW finger transducer in positive is then placed over the face and ultraviolet light shone through the mask to transfer the pattern to the photoresist. After development according to the instructions of the photoresist manufacturer, the pattern of the transducers 5, 7 is left in the photoresist and the unwanted regions of metal are left exposed for removal. The removal of the unwanted aluminium can be achieved with an alkaline etch such as KOH dissolved in water. The remaining photoresist can then be removed using the manufacturers recommended solvent. This process leaves the metallized fingers and bonding pads in the aluminum layer on the polished surface of the substrate.

In a variation of the above method, a positive photoresist can be used in combination with a negative photolithographic UV exposure mask to provide the photoresist etch mask.

Method II

A thin layer of negative photoresist (3000Å thick) is spun onto the polished surface of the substrate 1 and baked dry. A negative photolithographic mask of the SAW device is used to expose UV light onto the areas where metallisation is required. The photoresist is then developed to open 'windows' in the layer and a brief plasma ash follows to remove any traces of residual unwanted photoresist from the 'windows' which have been opened in the photoresist mask. A thin (typically 1000Å) layer of aluminium or other suitable metal or metal combination (e.g. gold on chrome or gold on nichrome) is deposited by vacuum evaporation onto the substrate. The photoresist remaining on the substrate is then removed in acetone, lifting-off the unwanted metal and leaving the required device metallization pattern 5, 7 on the substrate.

Method III

A sequence is followed as for Method I, up to, but not including, the removal of the unwanted metal by an alkaline chemical etch. The unwanted metal can then be removed by ion beam milling in an argon or argon/hydrogen atmosphere in an ion beam miller such as a Millatron IV (made by Commonwealth Scientific, Alexandria, Va. (USA).

Typical ion beam etch rates for aluminium, lithium tetraborate and the AZ1350J photoresist mask in 600 eV beams are as given in table 3:

TABLE 3

| | ION BEAM MILLING RATES FOR 600 eV BEAMS | | |
|---|---|---|---|
| | Etch Rates (Å minute$^{-1}$) | | |
| Beam | (100) cut $Li_2B_4O_7$ | Aluminium | AZ13505 |
| Ar | 150 | 150 | 280 |
| Ar-3% $H_2$ | 190 | 230 | 230 |

After the patterning of the metallized layer, the completed SAW substrate can be bonded into a suitable device header and wires bonded to the transducer in the standard fashion using, for example, an ultrasonic wire bonder such as a Kulicke and Soffa Industries Inc. Model No. 1419.

2. Example of SAW Devices using Lithium Tetraborate

Figure 10:
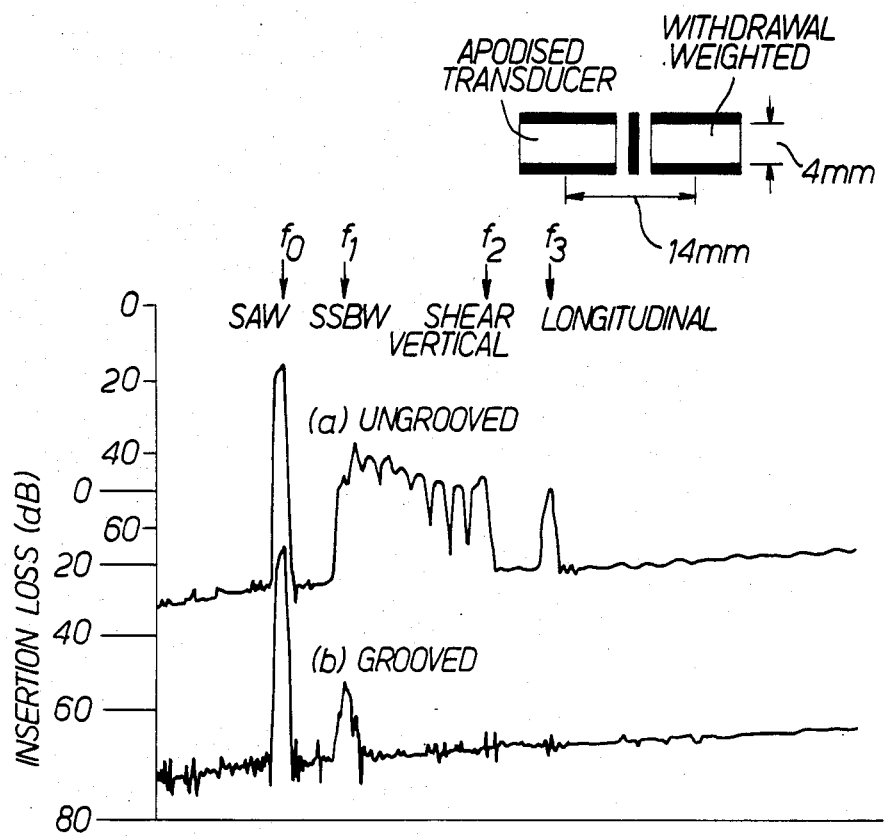
FIG. 10 is a graph showing insertion loss as a function of frequency measured for a narrow-band SAW device such as shown in the preceding figure.
Figure 11:
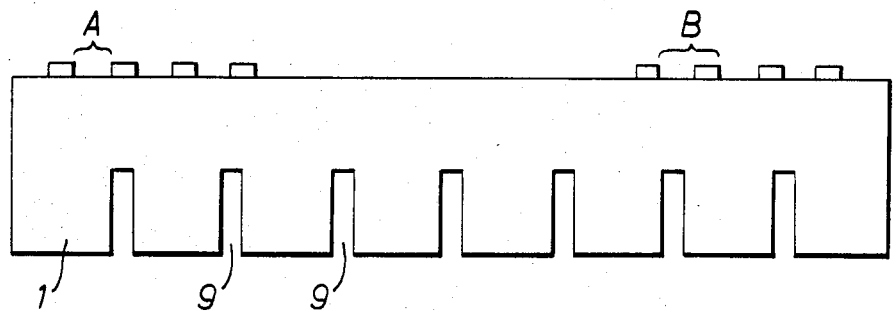
FIGS. 11 and 12 show cross-sections of a SAW device with a grooved back face and with an angle-lapped back face, respectively.

As specific examples of SAW devices using lithium tetraborate, the following are cited in detail:

(a) Narrow band filter:

This example is cited to illustrate a means for reducing out-of-band bulk wave responses in SAW devices using lithium tetraborate. The device transducers were designed using withdrawal weighting and apodisation, each transducer being 240 $\lambda_o$ long and 90 $\lambda_o$ wide, with a wavelength $\lambda_o$ of 45 μm. A drawing of the layout of the two main transducers (A and B) is given in FIG. 9. It can be seen that there is also a narrow, unapodised uniform test transducer (c) between transducers A and B. All text results referred to below use transducers A and B only. The insertion loss of the filter fabricated on a substrate as described in 1. above is as shown in FIG. 11. The main SAW response is at 79 MHz, with a 1 dB bandwidth of 1.1 MHz. Strong bulk wave spurious responses were observed over the range 87 MHz to 114 MHz. It was found that these could be largely eliminated by grooving the back of the substrate 1 after metallisation, as shown schematically in FIG. 11. A typical grooving pattern suitable for bulk wave elimination would be grooves 9 150 μm deep by 100 μm wide on an irregular pitch of around 500 μm. Such grooves can be cut using a semiconductor substrate dicing saw. FIG. 10 also shows the response of a device possessing such a sawn back. It can be seen that the bulk wave spurious response is much reduced by the grooving 9. The remaining weak spurious response is due to a surface skimming bulk wave (SSBW). The strength of this SSBW response can be reduced either by using the cancellation scheme described in the device example (b) below or by increasing the distance between the two transducers A, B (as discussed in example (c)).

Figure 12:
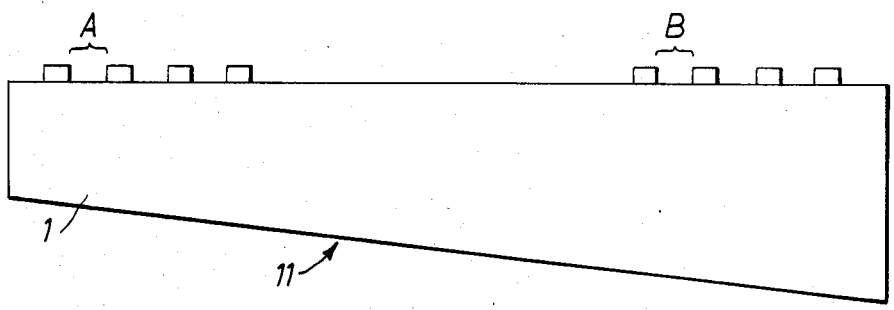

It should also be noted that a second means for reducing the spurious out-of-band bulk wave response is to lap the back 11 of the SAW substrate 1 so that it is no longer parallel to the front surface carrying the metallisation pattern A, B as shown in FIG. 12. This reduces the response from all these bulk waves except the SSBW.

Figure 13:
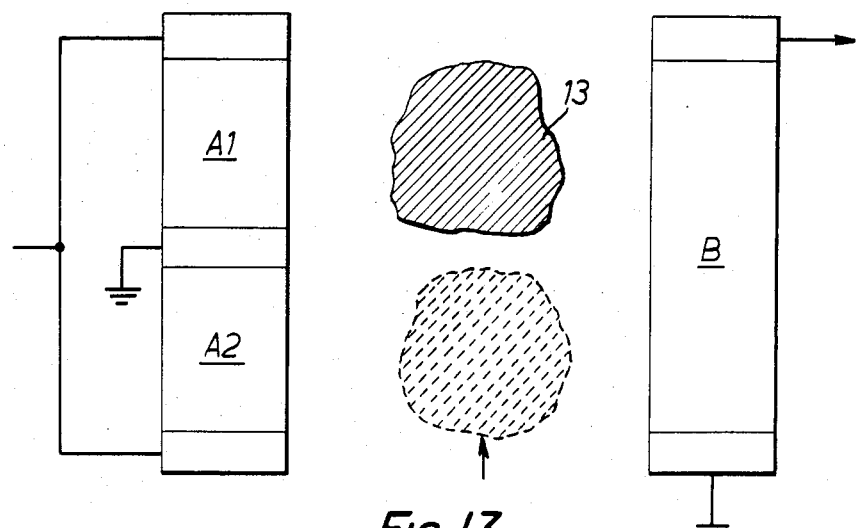
FIGS. 13 and 14 are schematic plan views showing the transducer arrangement for alternative SSBW cancellation schemes.
Figure 14:
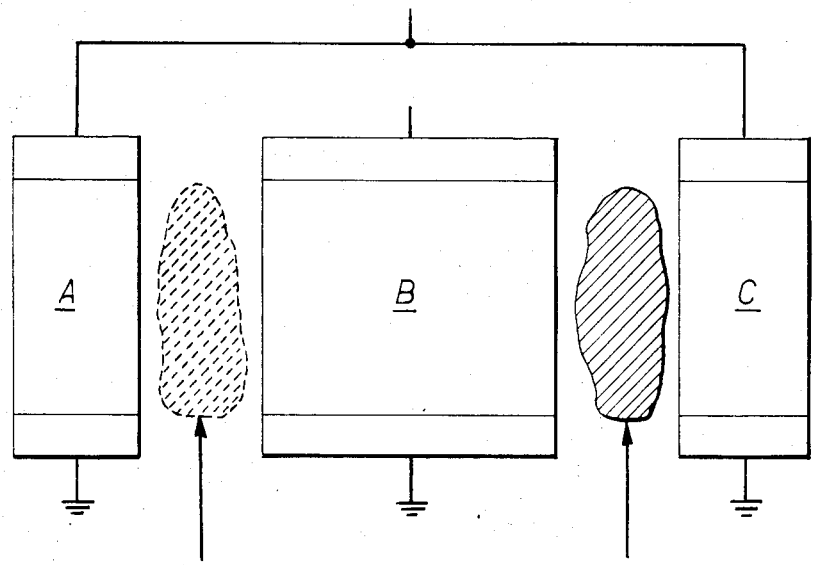
Figure 15:
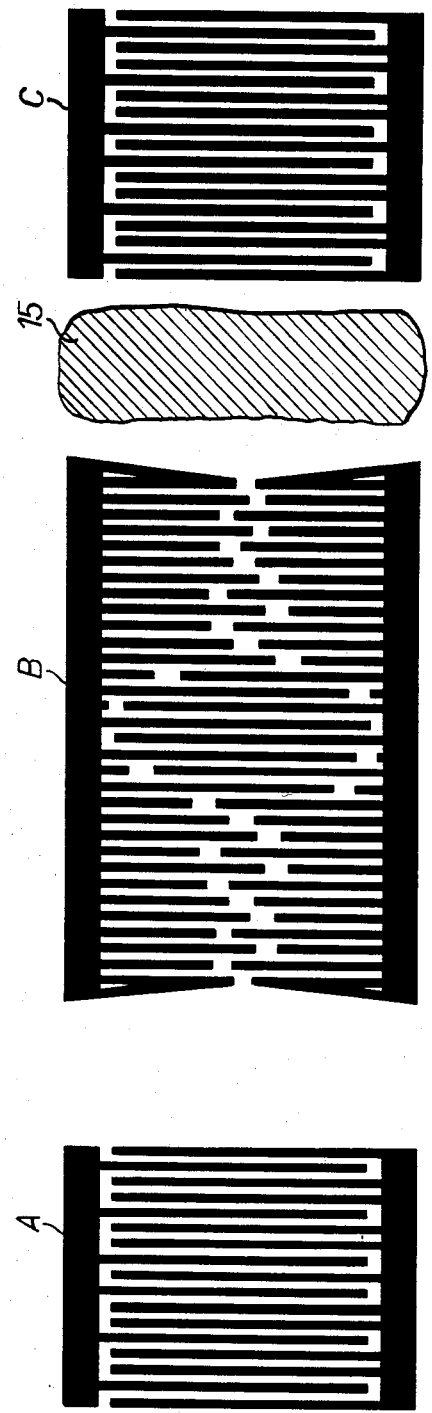
FIG. 15 is a detailed plan view of the transducer arrangement of the preceding figure.

(b) Device incorporating surface skimming bulk wave suppression:

Two transducer schemes which can be used for SSBW suppression are shown in FIGS. 13 and 14. In FIG. 13 transducer A consists of two sub-transducers A1 and A2, which are identical but driven in antiphase. Transducer B receives signals from both A1 and A2 which are 180° out-of-phase. An absorber 13 (such as a layer of a silicone rubber) is deposited over the propagation region between transducers A1 and B. This absorbs the surface wave, but not the SSBW. The consequence of this arrangement is that the SSBW signals tend to cancel at the receiving transducer, while the SAW signal is received from only one transducer. A second arrangement, which uses the same principle of absorption, is shown in FIG. 15. This uses three transducers (A, B and C in FIG. 15) and a layer of absorber 15 between either B and A or B and C. Transducer B is arranged to possess antisymmetric symmetry, so that the surface and bulk waves emerging in each direction have relative phases of ±90°. The outputs from A and C are summed and the absorber then performs the same function as in FIG. 14 discussed above.

Figure 16:
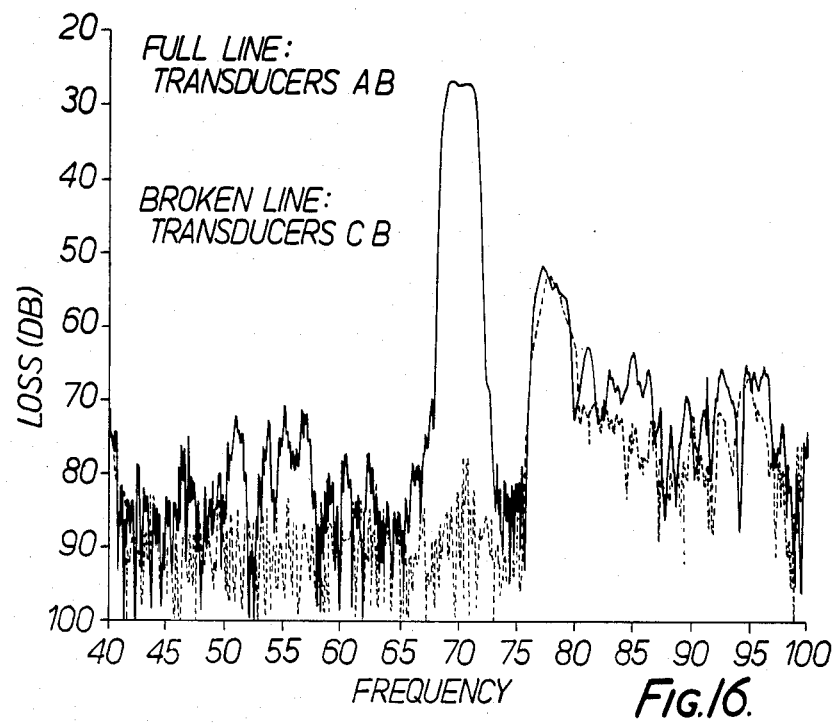
FIGS. 16 and 17 are graphs showing insertion loss versus frequency for the grooved back device of FIG. 11 above.
Figure 17:
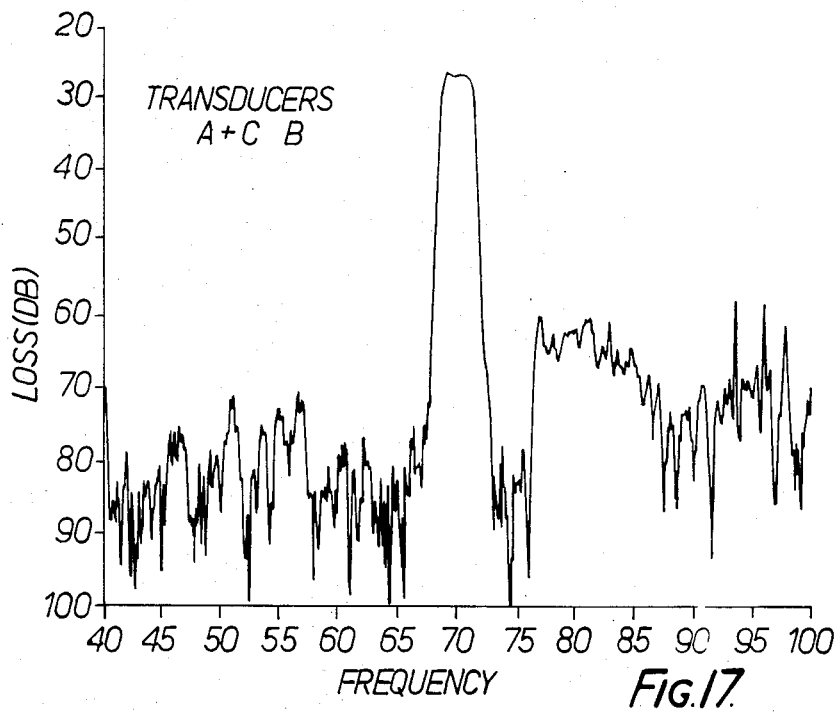

FIG. 15 shows the transducer design for a practical implementation of FIG. 14. The central transducer is 1.5 uS apodised and the two outer transducers 1.1 uS withdrawal weighted. The tilted fingers at each end of the apodised transducer possess end displacements of 3 $\lambda_o$ (with $\lambda_o=45$ um). The lengths, apertures, and, wavelength, of each transducer are as for the transducers in example (a) above. The device substrate was back-grooved as in example (a) above. FIG. 16 shows the insertion loss measured between transducers A and C and between B and C. The prominent SSBW peak can be clearly seen for both, with the absorber removing the SAW response between B and C. FIG. 17 shows the insertion loss between B and transducers A and C summed together. There is a 10 dB reduction in the height of the SSBW response because of the cancellation effected.

Figure 18:
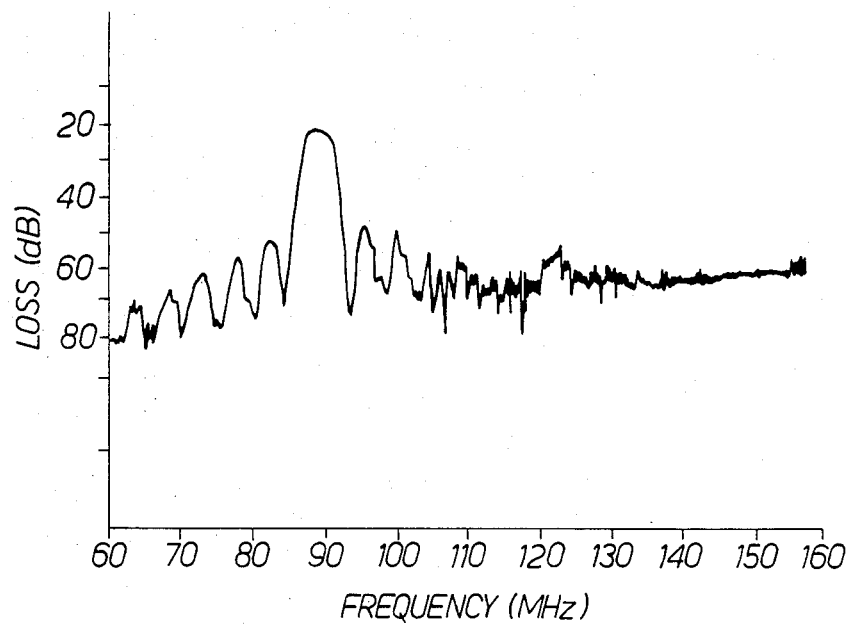
FIG. 18 is a further graph showing insertion loss versus frequency for a broadband, long propagation length device.

(c) Broad band device with long propagation delay:

This example is cited to illustrate a case where SSBW cancellation is not required on Lithium Tetraborate. This is the case of broad-band devices with relatively long propagation lengths. In this particular example, the transducers are 20 wavelengths long and of 100 wavelengths aperture and are uniform. The transducers are separated by 225 wavelengths and the wavelength is set (in this particular case) at 40 μm, giving a fundamental frequency of 89 MHz. A grooved substrate was used as described above. FIG. 18 shows the variation of insertion loss with frequency in this device. There is no spurious bulk wave response. In general, with X-cut, Z-propagating $Li_2B_4O_7$, it is found that such relatively broad bandwidth devices possessing long delays are free from SSBW spurious responses.

3. Fabrication of SAW devices on substrate orientations other than X-cut, Z-propagating.

The examples cited in 2. above are for the X-cut, Z-propagating orientation of $Li_2B_4O_7$. It has been demonstrated that devices can be made on orientations other than this and these devices can be made in exactly the same way as described in section 1. above and the basic properties of these (SAW velocity, temperature coefficient of delay and SAW coupling factor) are described in detail in table 2a.

Devices made close to X-cut, Z-propagating have similar characteristics to those with exactly X-cut, Z-propagating. (In this context, "close-to" means that the orientation of the substrate and/or the propagation direction are within 5° of X-cut and Z-propagating.)

BULK WAVE PIEZOELECTRIC DEVICES USING $Li_2B_4O_7$

Figure 19:
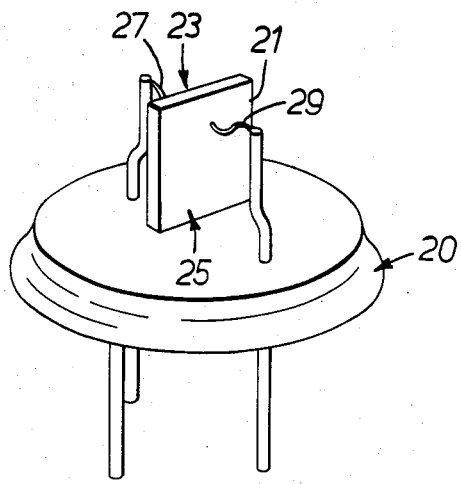
FIG. 19 is a perspective view of a bulk wave piezoelectric device.

Bulk wave piezoelectric devices 20 can be fabricated on lithium tetraborate using the following methods. Referring to FIG. 19, a thin crystal plate 21 is cut normal to the axis and lapped and polished to the required thickness. The plate 21 is cleaned using the same technique as for SAW substrates and metal electrodes 23, 25 (such as aluminium or gold) evaporated onto opposite surfaces of the plate 21. Wires 27, 29 are attached either by wire bonding or by using spring clips.

Figure 20:
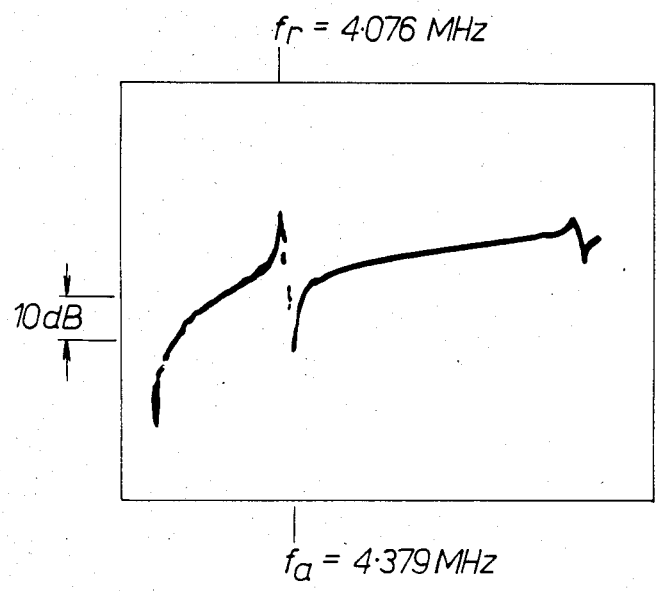
FIG. 20 is a graph showing the admittance versus frequency characteristic of a Z-cut plate of lithium tetraborate.

FIG. 20 shows the frequency response of the admittance of a rectangular plate of $Li_2B_4O_7$ cut normal to the crystallographic 'Z' axis. The dimensions of this plate 21 are 0.588 mm thick and 10 mm by 10 mm. This plate orientation can be excited into its thickness extensional mode by means of electrodes applied as described above to the major faces.

$$f_a = \frac{1}{2t} \sqrt{\frac{C_{33}^D}{\rho}}$$

where
t = plate thickness
$\rho$ = material density = 2.461 g cm$^{-3}$
$C^D_{33}$ = elastic constant tensor coefficient at constant electrical displacement.

$C^D_{33}$ is related to the value of $C^E_{33}$ given in Table 1 by:

$$C^E_{33} = D^D_{33}(1 - k_T^2)$$

where $k_t$ is the thickness coupling coefficient, given by:

$$k_T^2 = \frac{\pi}{2} \frac{f_r}{f_a} \tan\left(\frac{\pi}{2}\left(\frac{f_r - f_a}{f_a}\right)\right)$$

where $f_r$ = resonant frequency of crystal plate.

Figure 21:
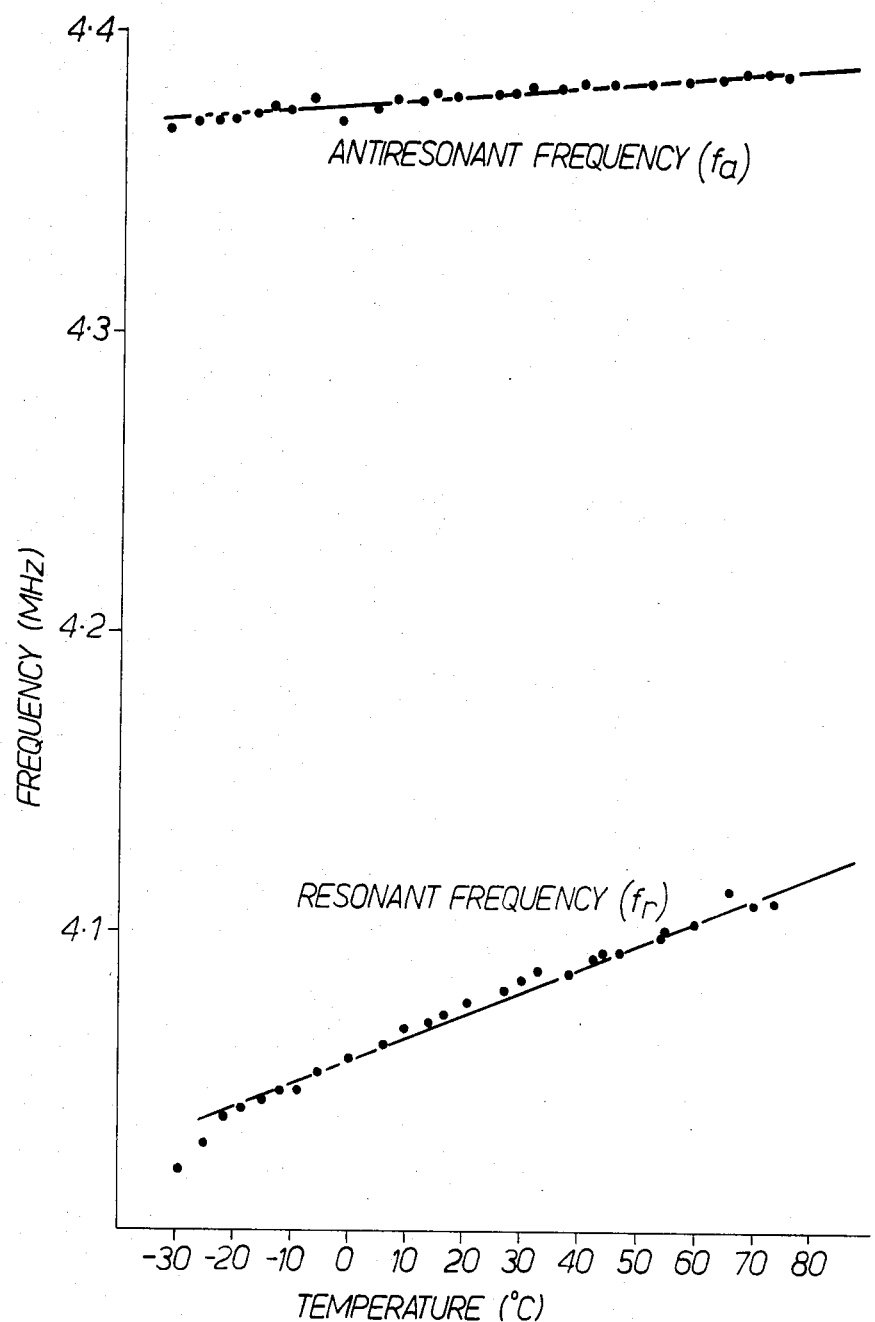
FIG. 21 is a graph showing the measured temperature dependence of the thickness mode resonant (lower plot) and antiresonant (upper plot) frequencies of Z-cut lithium tetraborate.

FIG. 20 show the fundamental mode resonant and antiresonant frequencies of this plate as being 4.076 MHz and 4.379 MHz respectively at 20° C. The temperature variation of these two frequencies from −30° C. to +80° C. is shown in FIG. 21. Other orientations of lithium tetraborate can be excited into different modes.

The figure of merit for performance of a passive bulk wave acoustic sensing device—eg. a hydrophone, is calculated as follows: $F = d_h g_h = (d_{33} + 2d_{31})2/\varepsilon_{33}$
From Table 1:

$$d_{33} = \frac{e_{31}c_{13} - e_{33}(c_{11} + c_{12})}{c_{13}^2 c_{22}(d_{11} + c_{12})}$$

$$= 15.81 \, pC/N.$$

$$d_{31} = \frac{e_{31}c_{33} - e_{33}c_{13}}{(c_{11} + c_{12})(c_{33}) - 2c_{13}^2}$$

-continued $$= -3.09 \, pC/N.$$

$$F = 1,654 \times 10^{-15} \, m^2/N.$$

This figure compared very favorably to the figure of ~1,000×10⁻¹⁵ m²/N for the polymer piezoelectric polyvinylidene flouride which is under active consideration as a hydrophone material.

Lithium tetraborate also has a set of pyroelectric and dielectric properties which make it suitable for use as a pyroelectric infra-red detector/thermal imaging system target material. Table 4 lists the values of its pyroelectric coefficient (p(T)), dielectric constant ($\epsilon$) and dielectric loss (tan $\delta$) measured parallel to the polar axis at room temperature (20° C.). Also listed on this table are the material's volume specific heat ($C^1$) and resistivity parallel to the polar axis (p), again at 20° C.

TABLE 4

THE PYROELECTRIC PROPERTIES OF A NUMBER OF MATERIALS AT 20° C.

| Material | p(T) 10⁻⁸ Ccm⁻²K⁻¹ | $\epsilon$ at 1592 Hz | tan $\delta$ | $\rho$ $\Omega$cm | c' Jcm⁻³K⁻¹ | $F_1 = \frac{p(T)}{c'\epsilon}$ 10⁻¹⁰ CcmJ⁻¹ | $F_2 = \frac{p(T)}{(c'\epsilon \tan\delta)^{\frac{1}{2}}}$ 10⁻⁸ | $\rho\epsilon\epsilon_o$ sec. | $T_c$ °C. |
|---|---|---|---|---|---|---|---|---|---|
| DTGS | 3.3 | 25 | 2 × 10⁻³ | >10¹² | 2.5 | 5.3 | 9.3 | >20 | 60 |
| LiTaO₃ | 1.9 | 43 | 1 × 10⁻³ | >10¹⁴ | 3.2 | 1.38 | 5.1 | >500 | 618 |
| Sr₀.₅Ba₀.₅Nb₂O₆ | 6.5 | 380 | 3 × 10⁻³ | 10¹¹ | 2.1 | 0.81 | 4.2 | 3.36 | 121 |
| Pb₅Ge₃O₁₁ | 1.1 | 45 | 1 × 10⁻³ | 5 × 10¹¹ | 2.0 | 1.22 | 3.7 | 1.99 | 178 |
| Li₂B₄O₇ | 0.5 | 10 | 0.03 | 5 × 10¹⁰ | 3.2 | 1.6 | 0.5 | 0.04 | — |

A substance's suitability for use in pyroelectric detection systems can be measured in terms of one of its pyroelectric figures-of-merit, which can be defined as follows. The voltage responsivity of a single element detector can be shown to be proportional to:

$$F_1 = p(T)/c\epsilon$$

(This figure of merit also measures a material's suitability for use as a pyroelectric vidicon target material).

If the noise-sources in a single-element detector are considered, it can be shown that the Johnson Noise is minimised relative to the background temperature noise by chosing a material with the largest possible value of:

$$F_2 = \frac{p(T)}{(c'\epsilon\tan\delta)^{\frac{1}{2}}}$$

This figure measures material's suitability for use in a single element detector.

Finally, if a pyroelectric material is to be used as a vidicon target it can be used in a conduction pedestal mode only if its electric time constant, $T_C = p \cdot \epsilon \cdot \epsilon_o$ is between 0.04 and 1 sec.

Table 4 lists the values of $F_1$, $F_2$ and $p \cdot \epsilon \cdot \epsilon_o$ for lithium tetraborate and, for comparison, also lists the corresponding values for four other pyroelectric single crystals: lithium tantalate (LiTaO₃), strontium barium niobate (SBN-Sr₀.₅Ba₀.₅Nb₂O₆), lead germanate (Pb₅Ge₃O₁₁) and deuterated triglycine sulphate (DTGS). It can be seen that, of these materials, DTGS gives the highest values for $F_1$ and $F_2$, although its electrical resistivity renders it unsuitable for use in a conventional-mode pedestal vidicon tube, so that when it is used as a vidicon target other, less convenient, pedestal generation techniques are necessary. Furthermore, DTGS is relatively difficult to use because of its water solubility, low ferroelectric Curie temperature ($T_c$) and chemical instability at elevated temperatures. Of the other, more robust, oxide single crystal materials (LiTaO₃, SBN or Pb₅Ge₃O₁₁), LiTaO₃ is the one most commonly used for single element detectors because of its high values of $F_1$ and $F_2$. Until recently, this has also looked to be the most promising material for use as an oxide pyroelectric vidicon target, in spite of its high electrical resistivity, and high thermal conductivity which necessitate reticulation of the target (i.e. dividing the target into thermally isolated islands≃50 um across by ion-beam etching).

Figure 22:
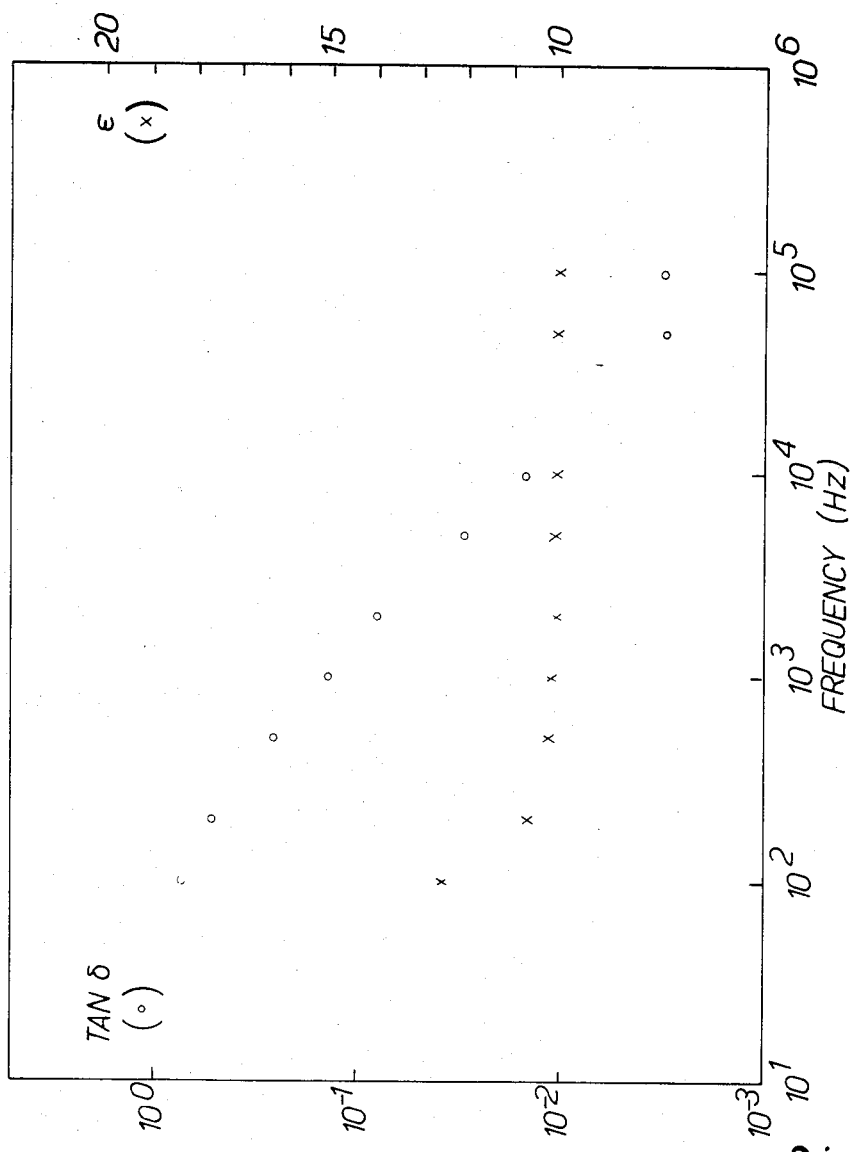
FIG. 22 is a graph showing dielectric loss (tan $\delta$) versus frequency for lithium tetraborate.

Lithium tetraborate possesses properties which give it a value of $F_1$ slightly greater than LiTaO₃ coupled with an electrical time constant of only 0.04 sec., making it good for use as a pyroelectric vidicon target which could be used in conduction pedestal mode. The high dielectric loss of lithium tetraborate indicates that it is not particularly suitable for use as a single-element detector material at frequencies below 2 KHz. However, as shown in FIG. 22 its loss is strongly dependent upon frequency so that at frequencies above 50 KHz where tan$\delta \approx 3 \times 10^{-3}$, $F_2 = 1.6 \times 10^{-2}$ and therefore at these frequencies, although $F_2$ is still considerably smaller than the value for LiTaO₃, the material may be of interest for single element detectors.

Lithium tetraborate has one other major advantage over the other materials in table 4 in that it is non-ferroelectric. Thus, it does not need to be poled, nor is there any risk of any accidental thermal excursions depoling it, as there is with other more conventional materials.

Furthermore, because it possesses no ferroelectric domains, there can be no problems with thermally generated noise caused by domain-wall motion, as would appear to be one problem with LiTaO₃.

Lithium tetraborate therefore is a suitable material for a number of pyroelectric detector applications.

The following is cited as an example of a pyroelectric radiation detection device using lithium tetraborate. A typical device configuration is given in FIG. 23. Radiation passing through a transparent window at the top of a header 33 falls upon the absorbing upper electrode 35 on the Z-plate 37 of lithium tetraborate. In a version suitable for the detection of infra-red radiation in the range 8 to 12 $\mu$m, the window 21 would be made of polished silicon or germanium and the backing electrodes 35 would be platinum black, electroytically deposited from platinum chloride solution.) The radiation energy absorbed in the upper electrode heats the crystal and the charges released due to the pyroelectric effect give the signal output which is amplified using a high input impedance voltage amplifier such as a Field Effect Transistor (FET). In a variation of the device a FET can be included as a discrete chip within the pyroelectric device header 33. A suitable amplifier circuit is given in FIG. 24.

Figure 23:
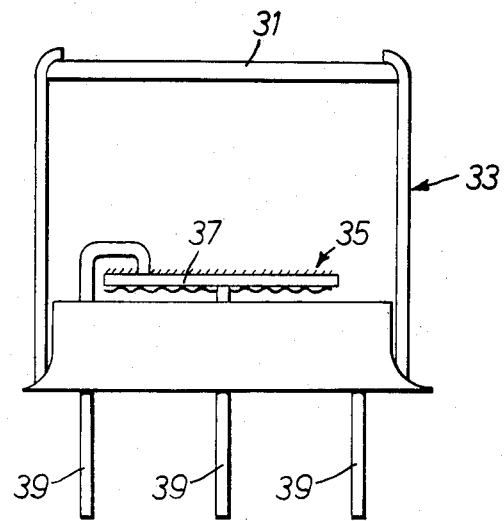
FIG. 23 is a cross-section of a pyroelectric detector device.
Figure 24:
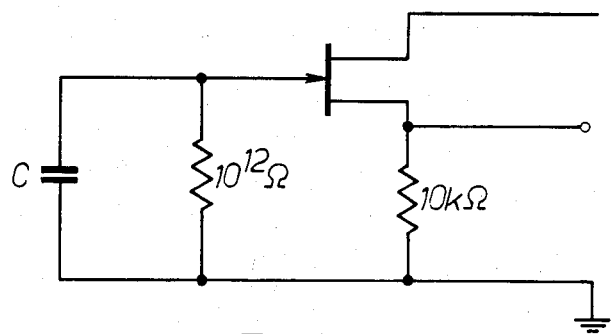
FIG. 24 is a circuit diagram of an FET source follower amplifier for use in the device shown in the preceding figure.

The device can be made in the following way. A thin plate 37 of crystal is cut normal to the z-axis and lapped and polished to 50 µm thick, or less. The plate is cleaned using the same methods as for fabricating SAW devices, and metal electrodes (usually gold on nichrome) evaporated or sputtered onto the major surfaces of the plate 37. The plate 37 is bonded into the device header 33 as shown in FIG. 23 using a conducting silver loaded epoxy resin (such as Eccobond Solder 57C (made by Emerson and Cuming, Canton, Mass.)) and wires bonded out to header leads 39. The platinum black can be applied at this stage, the cap bearing the window 21 is then welded to the header 33.

Having particularly described the invention and the manner in which it may be performed, we claim:

1. A piezo-electric device comprising a body of piezoelectric active material and electrodes adjacent to and in contact with said body, wherein said body is of single crystal lithium tetraborate material.

2. A device as claimed in claim 1, a surface acoustic wave device comprising a substrate body of piezo-electric active material; an input transducer electrode; and, an output transducer electrode; both electrodes being located apart on a major surface of said substrate, wherein, the substrate is of X-cut lithium tetraborate crystal and the electrodes are spaced apart in the Z-propagation direction.

3. A device, substantially as claimed in claim 2, but wherein the crystal cut is offset from but close to said X-cut.

4. A device, substantially as claimed in claim 2, but wherein the transducer electrodes are arranged offset from but close to said Z-propagation direction.

5. A device, as claimed in claim 1, a bulk wave device comprising, a plate body of piezo-electric active material; an input electrode; and, an output electrode; each electrode being located adjacent to an opposite major face of said plate; wherein said plate is of Z-cut lithium tetraborate crystal material.

6. A device, as claimed in claim 5, but wherein said plate is cut offset from but close to said Z-cut.

7. A device, as claimed in claim 1, a pyroelectric device comprising a plate body of pyro-electric active material, a conducting and absorbing electrode adjacent one major face of the plate and a further electrode adjacent the other major face of the plate, wherein the plate is of Z-cut lithium tetraborate crystal material.

8. A device, as claimed in claim 7, but wherein the plate is cut offset from but close to said Z-cut.

* * * * *

REEXAMINATION CERTIFICATE (3187th)

United States Patent [19]
Whatmore et al.

[11] B1 4,634,913

[45] Certificate Issued *May 13, 1997

[54] APPLICATION OF LITHIUM TETRABORATE TO ELECTRONIC DEVICES

[75] Inventors: Roger W. Whatmore, Bletchley; Iain M. Young, Malvern, both of England

[73] Assignee: The Plessey Company Limited, Ilford, England

Reexamination Request:
No. 90/003,650, Dec. 1, 1994

Reexamination Certificate for:
Patent No.: 4,634,913
Issued: Jan. 6, 1987
Appl. No.: 703,653
Filed: Feb. 21, 1985

[*] Notice: The portion of the term of this patent subsequent to Jun. 29, 2004, has been disclaimed.

Related U.S. Application Data

[63] Continuation of Ser. No. 625,590, Jun. 29, 1984, Pat. No. 4,523,119, which is a continuation of Ser. No. 271,112, Jun. 8, 1981, abandoned.

[30] Foreign Application Priority Data

Jun. 11, 1980 [GB] United Kingdom ............... 8019062
Dec. 23, 1980 [GB] United Kingdom ............... 8041183

[51] Int. Cl.$^6$ ........................................... H01L 41/08
[52] U.S. Cl. ................... 310/313 A; 310/313 D; 310/360
[58] Field of Search ................ 310/313 A, 313 R, 310/313 D, 311, 360; 333/150–155, 193–196

[56] References Cited

FOREIGN PATENT DOCUMENTS 2083694 3/1982 United Kingdom.

OTHER PUBLICATIONS

Cady, "Piezoelectricity, An Introduction to the Theory and Applications of Electromechanical Phenomena in Crystals," McGraw-Hill Company, Inc., London 1946.
Bell et al, "Surface–Acoustic–Wave Resonators," Proceedings of the IEEE, vol. 64, No. 5, pp. 711–721, (May 1976).
Sastry et al, "Studies in Lithium Oxide Systems: I, $Li_2O.B_2O_3$–$B_2O_3$," Journal of the American Ceramic Society, vol. 41, No. 1, pp. 4–17 (1958).
Sastry et al, "Studies in Lithium Oxide Systems: V, $Li_2O$–$Li_2O.B_2O_3$", Journal of the American Ceramic Society, vol. 42, No. 5, pp. 216–218 (1959).
Krogh–Moe, "The Crystal Structure of Lithium Diborate, $Li_2O.2B_2O_3$," Acta Crystal, vol. 15, pp. 190–193 (1962).
Krogh–Moe, "Refinement of the Crystal Structure of Lithium Diborate, $Li_2O.2B_2O_3$," Acta Crystal, vol. B24, pp. 179–181 (1968).
Natarajan et al, "Dilithium Tetraborate, $Li_2B_4O_7$," Cryst. Struct Comm., vol. 8, pp. 367–370 (1979).
Garret et al, "The Czochralski Growth of $LiBO_2$ and $Li_2B_4O_7$," Journal of Crystal Growth 41, pp. 225–227 (1977).
T. Janssen, "Crystallographic Groups," American Elsevier Publishing Company, Inc., New York (1973).
Whatmore, "Lithium Tetraborate: A new Temperature–Compensated SAW Substrate Material," Electronics Letters, vol. 17, No. 1, pp. 11–12 (Jan. 8, 1981).
Whatmore, "New Polar Materials: Their Application to SAW and Other Divices," Journal of Crystal Growth, vol. 48, pp. 530–547.

(List continued on next page.)

*Primary Examiner*—Mark O. Budd

[57] ABSTRACT

An electronic device, such as a Surface Wave, Bulk Wave or pyroelectric device, exploiting the polar nature of an active material in which the active material is lithium tetraborate or a closely related compound for example one which is slightly deficient in Lithium or Boron e.g. $(Li_{2\mp\delta_1})B_4O_7$ or $Li_2(B_{4\mp\delta_2})O_7$ where $\delta_1$ and $\delta_2$ are small numbers.

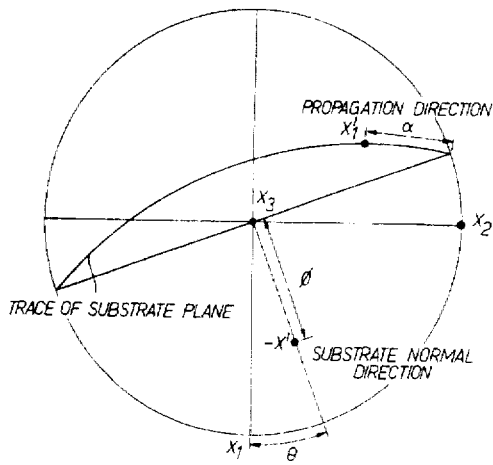

OTHER PUBLICATIONS

Heising, "Quartz Crystals for Electrical Circuits," D. Van Nostrand Company, Inc., Bell Telephone Laboratories, Inc., pp. 333–355, May 1946.

White, "Surface Elastic Waves," Proceedings of the IEEE, vol. 58, No. 8, pp. 1238–1276, Aug. 1970.

Landolt–Börnstein, "Numerical Data and Functional Relationships in Science and Technology", vol. 11, 1979, pp. IX through XVII.

Landolt–Börnstein, "Numerical Data and Functional Relationships in Science and Technology", vol. 16, Subvol. b, 1982, Table of Contents, 3 pages.

Landolt–Börnstein, "Numerical Data and Functional Relationships in Science and Technology", vol. 28, Subvol. a, 1989, Table of Contents, 3 pages.

Lewis et al., "An Assessment of Lithium Tetraborate for SAW Applications", Proceedings of 1982 Ultrasonic Symposium, San Diego, Oct. 1982, pp. 1–5.

Peach et al., "High Coupling Piezoelectric Resonators Using Lithium Tetraborate", 1983 Ultrasonics Symposium, Atlanta, Nov. 1983, pp. 521–525.

"International Tables for X–Ray Crystallography", The Kynoch Press, Birmingham England, 1952, p. 200.

Mason, "Physical Acoustics", vol. I–Part A, Academic Press, 1964 pp. 174–177.

"Surface Wave Device and Application Thereof", pp. 71–75 (w/Translation).

No. 3, "Physical Science Library 2: X–Ray Crystal Analysis", pp. 324–325.

"Lectures on Material Engineering: Material Engineering for Magnetic and Dielectric Substances", pp. 192–193.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–8 is confirmed.

\* \* \* \* \*